(12) United States Patent
Young

(10) Patent No.: US 6,307,373 B1
(45) Date of Patent: Oct. 23, 2001

(54) ANTI-ALIASING TRANSMITTER COIL ARRAY FOR MAGNETIC RESONANCE

(75) Inventor: Ian Robert Young, West Overton Nr Marlborough (GB)

(73) Assignee: Picker International, Inc., Highland Heights, OH (US)

( * ) Notice: Subject to any disclaimer, the term of this patent is extended or adjusted under 35 U.S.C. 154(b) by 0 days.

(21) Appl. No.: 09/323,649

(22) Filed: Jun. 1, 1999

(30) Foreign Application Priority Data

May 28, 1998 (GB) .................................................. 9811445

(51) Int. Cl.⁷ ............................. G01V 3/00; A61B 5/055
(52) U.S. Cl. ......................... 324/322; 324/309; 324/318
(58) Field of Search ................................. 324/318–322, 324/309, 307

(56) References Cited

U.S. PATENT DOCUMENTS

| 4,682,112 | 7/1987 | Beer | 324/322 |
|---|---|---|---|
| 4,851,777 | 7/1989 | Macovski | 324/309 |
| 5,252,922 | 10/1993 | Larson | 324/309 |

FOREIGN PATENT DOCUMENTS

| 0 511 809 | 11/1992 | (EP) . |
|---|---|---|
| 2 530 816 | 1/1984 | (FR) . |
| 1094330 A | * 4/2001 | (GB) . |

* cited by examiner

Primary Examiner—Hezron Williams
Assistant Examiner—Tiffany A. Fetzner
(74) Attorney, Agent, or Firm—John R. Fry; Thomas M. Lundin

(57) ABSTRACT

In a magnetic resonance imaging apparatus 1 there is a region of good i.e. uniform field between A and B but, where the field falls off, say, at D, the r.f. excitation pulse can produce an alias image of D which overlies the desired image of say, B. To reduce this effect, the r.f. excitation coil 4 comprises an array of small coils, the amplitude and phase of the excitation of which is controlled so that the r.f. field collapses rapidly outside the region of good field.

17 Claims, 3 Drawing Sheets

ANTI-ALIASING TRANSMITTER COIL ARRAY FOR MAGNETIC RESONANCE

BACKGROUND

This invention relates to magnetic resonance imaging apparatus.

Such apparatus comprises a magnet for producing a main magnetic field to align magnetic resonant (MR) active nuclei such as hydrogen in tissue in a patient or object, and r.f. excitation means to excite these nuclei to resonance. The resulting relaxation signals generated by the nuclei are picked up by a receive coil, and provide information on the distribution of the nuclei and hence information about the tissue itself. The signal is spatially encoded by means for generating magnetic field gradients.

Typically, only a selected region of the patient is excited, but noise is generated from all parts of the patient, whether excited or not. In the interests of improving the signal-to-noise ratio, it has been proposed (U.S. Pat. No. 4,851,777, U.S. Pat. No. 4,682,112) to provide an array of receive coils, the relative amplitude and phases of the signals from which being such that certain regions are nulled out i.e. signal is only collected from the region of interest. It has also been proposed in the same publications to use such an array of coils to excite only the region of interest. This would then avoid unnecessary heat input to the remainder of the patient.

In any magnetic resonance imaging apparatus, the region selected for imaging is within the region of good field produced by the magnet system. The requirements for the region of good field is that the field of the main magnet must be homogeneous to a very high degree, and the magnetic field gradients imposed on the main field must be uniform to a very high degree.

The steepness of the magnetic field gradient in the axial direction may be influenced by the design of the imaging apparatus. Thus, in the interests of patient comfort, the axial length of magnets is being reduced, to avoid the need for the patient to be accommodated in a deep bore which could cause problems of claustrophobia. The axial magnetic field gradient, which usually defines the "slice" of the patient being imaged must necessarily then be steeper than hitherto. The gradient falls off outside the region of good field, but because the gradient is steeper, the fall off now takes place closer to the region of good field than hitherto.

The particular slice selected in the region of good field is determined by the frequency of the r.f. excitation pulse which excites nuclei precessing at a certain frequency. The frequency at which the nuclei precess in turn is dependent on the magnetic field strength i.e. the point along the gradient in the axial direction. Unfortunately where the magnetic field strength falls off, it will pass through the same value as that which defines the selected slice. This region will also therefore be excited, and will impair the desired image picked up by the receive coil. This so-called aliasing is a known problem, but the shorter magnet makes it worse.

SUMMARY

The invention provides magnetic resonance imaging apparatus comprising means for producing a desired magnetic field distribution over an imaging region, r.f. excitation means for exciting nuclei to resonance, wherein the r.f. excitation means comprises an array of coils and means for controlling the amplitude and phase of the signal transmitted by each coil so as to confine the r.f. field to a desired region, to reduce aliasing in the images produced.

The use of an array of coils to make the r.f. excitation pulse collapse where desired outside the region of good field solves the problem of aliasing for a short magnet.

While a single receive coil may be provided for receiving the relaxation signals generated by the relaxing nuclei, preferably, an array of receiver coils is provided, and the amplitude and phase of the signals produced by each coil is controlled so as to reduce the signal received outside a desired region. Thus, the reduction of aliasing may be improved by using an array of coils for receive as well as for transmit. Preferably, the same array is used for both purposes.

The invention is applicable to electro-magnets as well as to permanent magnets for producing the main field.

DRAWINGS

Magnetic resonance imaging apparatus constructed in accordance with the invention will now be described, by way of example, with reference to the accompanying drawings, in which.

DESCRIPTION

Figure 1:
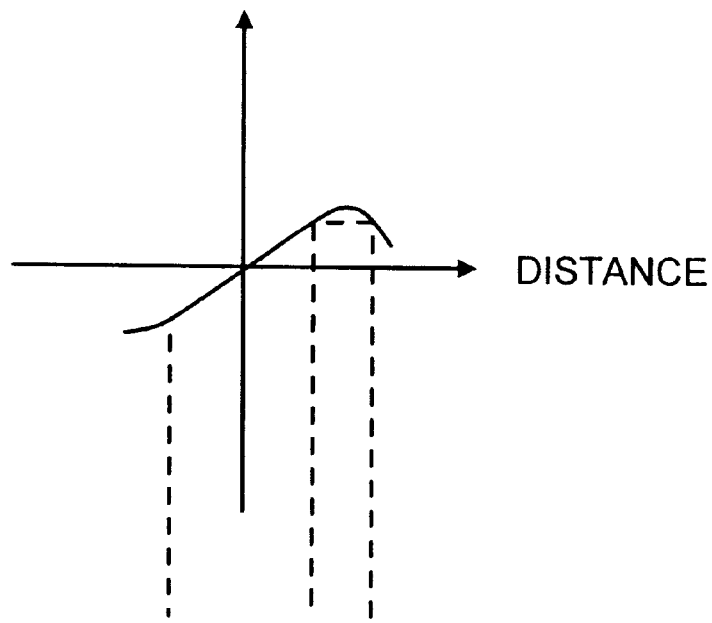
FIG. 1 is a representation of the variation of the magnetic field gradient with distance along the axis of the imaging apparatus.
Figure 2:
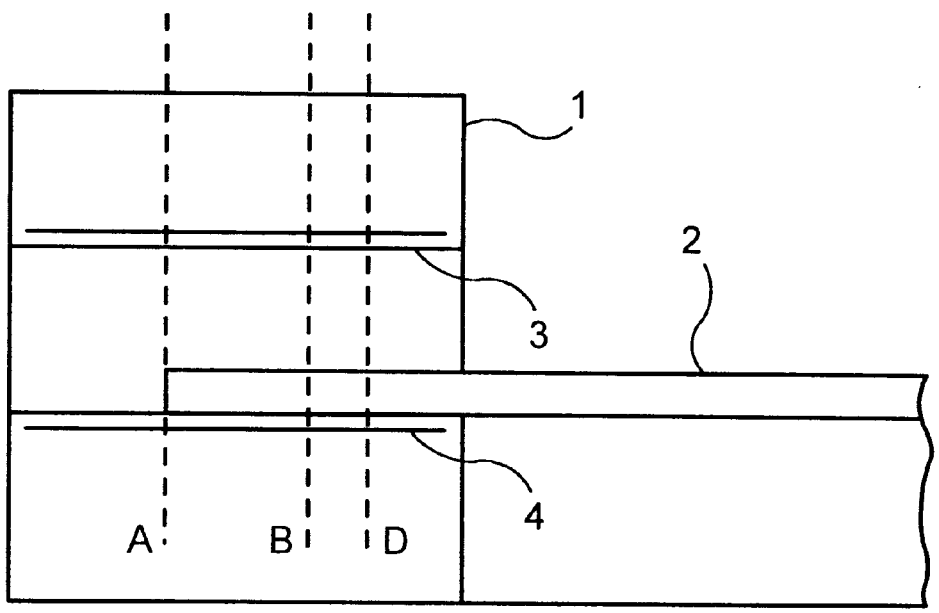
FIG. 2 is a schematic sectional view of the imaging apparatus.

The magnetic resonance imaging apparatus of the invention as shown in FIG. 2 produces its main field by means of a superconducting magnet contained within a housing 1. The patient lies on the bed 2 which may be slid out of and into the bore of the magnet 3. In addition to the main magnet, which produces a field along the axis of the bore, the imaging apparatus includes coils for producing magnetic field gradients, along the length of the bore, in order to define a radial slice of the patient to be imaged, and in two directions at right angles in the plane of that slice. The strength of the magnetic field in the axial direction of the bore is shown in FIG. 1. It will be seen that the gradient is linear between dotted lines A and B, and this defines the extent of the region from which good images may be obtained in the axial direction.

Figure 3:
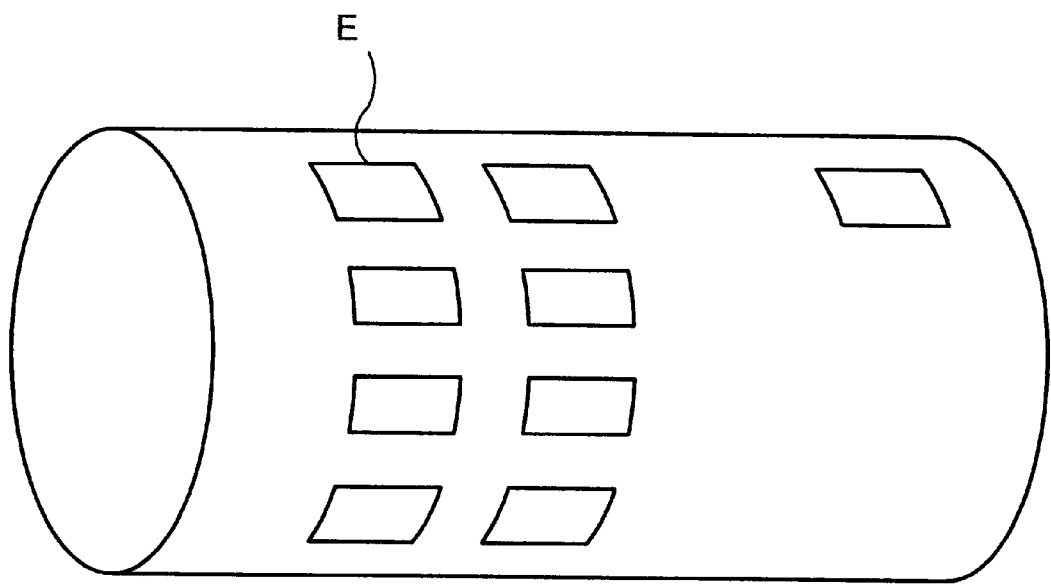
FIG. 3 shows the r.f. transmit coil of the apparatus of FIG. 2.

The means for exciting the nuclei to resonance comprises a cylindrical r.f. excitation means 4, which is also shown in FIG. 3. This comprises an array of coils E arranged with N coils around the circumference of the cylinder and M coils along the length of the cylinder i.e. a total of NM coils.

The r.f. excitation means excites nuclei to resonance at the particular frequency at which it transmits, and the slice selected depends upon the strength of the magnetic field, because this affects the frequency of precession of the nuclei. It will be seen that a problem arises if the coil excites nuclei in the radial plane passing through dotted line B, because the fall off of the magnetic field outside the region of good field means that there is another region relatively close by which would also be excited, lying within a radial plane coinciding with the dotted line D.

The desired image from position B would be overlaid by aliased data from D.

This is avoided by the use of the array of coils of FIG. 3 and their method of being driven.

It must be remembered that the individual loops or coils E do not form a phased array because their sizes are small compared to the wavelength in question (hundreds of centimetres). It is in fact a near field situation.

Figure 4:
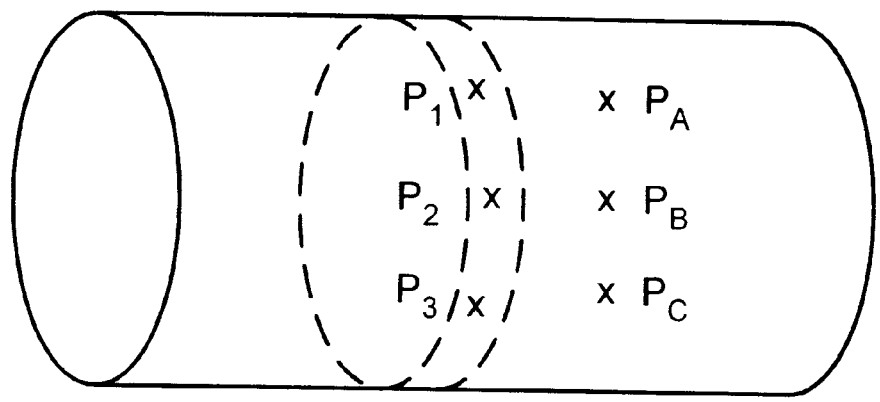
FIG. 4 shows a possible region of interest of the coil of FIG. 3.

In FIG. 3, the array of small receiver coils are shown arranged in an N×M array. In FIG. 4, a number of points Pi are defined inside a region it is desired to excite. The points plot out the spatial extent of the region ($P_1 \ldots P_x$) Another set of points $P_O$ (e.g. $P_A \ldots P_G \ldots P_X$), plot out the region into which minimal r.f. signal is desired.

Each coil is separately tuned, and the signal fed to it has an amplitude and phase (scaling factor $K_{ij}$ for coil in row i, column j) controlled by a computer. If the r.f. signal produced by a coil with unit current circulating in it at point $P_r$ which lies in the x,y plane of magnetisation i.e. in a radial slice, is $C_{ijr}$, then the total signal received at point $P_r$ is $$S_r = \sum_{i=1}^{N} \sum_{j=1}^{M} k_{ij} C_{ijr} \quad (1)$$

$S_r$, if in the region of interest, should desirably be 1; if outside the region of interest 0. Actually, for practical reasons, since N×M cannot be allowed to become too great, $S_r$ is allowed to approximate the these values.

Then, for the complete set of points P, shown in FIG. 4, a complete set of signals $S_p$ can be defined. The set of equations (1) can be solved simultaneously for the coefficient $K_{ij}$, if P=N×M.

Once this has been done a figure of merit can be attached to the achieved profile, and used to control the process. Suppose the error at point r is $\delta_r$ (when $\delta_r = S_{actual} - S_{desired}$) then an appropriate design target is:

$$W \frac{\sum_{r=1}^{\chi} (\delta_r)^2}{\chi} + \frac{\sum_{r=A}^{X} (\delta_r)^2}{X} \to 0 \quad (2)$$

where $\chi$ is the array of points inside the desired region of interest, and X the array of points outside it.

In this, the root mean square errors of those points inside the region of interest can be weighted by the factor W relative to those outside the region of interest to allow for design criteria such that it is more desirable to lose excitation in the region of interest than have excitation in the regions outside. Note that while the same points have been used here for both steps in the design target there is no reason why the check on performance (equation 2) should not be over different, and more or less points, than those involved in equations (1). It may be useful to have a double check with the calculation in (2) using both the original set of points, and other, different, ones.

Figure 5:
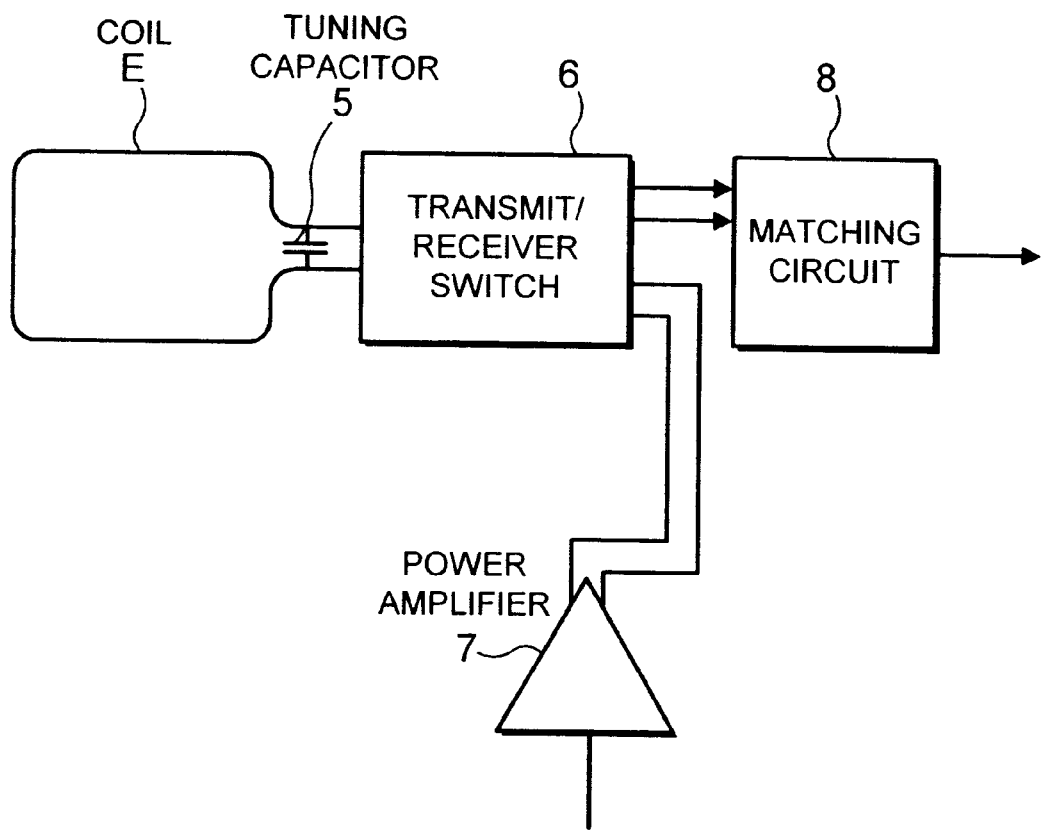
FIG. 5 is a block circuit diagram of the circuit for driving a coil.

FIG. 5 illustrates the circuit for transmitting the signal from a typical coil E and comprises a tuning capacitor 5, a transmit/receive switch 6 to either pass a transmit signal from a power amplifier 7 to the coil or to allow a received signal to pass to a pre-amplifier (not shown) via a matching circuit 8.

In the transmit mode, the amplitude and phase of the current supplied to the coils E is controlled so that the r.f. field collapses very close to the dotted line B in FIG. 2. The aliasing region is of course unaffected as it is determined by the gradients and main fields. It will be noted that the aliasing problem cannot arise in the vicinity of dotted line A.

In the receive mode, the same reasoning as employed above shows that the array of coils E can be used to minimise signal received from certain areas and maximise signal received from other areas. Thus, it would be desirable to maximise signal received in the vicinity of the good field (from A to B), and to minimise signal received from outside e.g. from region D. The region from which signal is received in the good field region could be even confined closer still to the vicinity of the "excited slice". Use of the array in the receive mode will have the advantage of improving the rejection of alias images, and of increasing the signal-to-noise by virtue of reducing the noise signal, which will be generated by all parts of the body.

A typical size of magnet would be of the order of the following dimensions 1200–1300 mm axial length, with a bore of diameter 700–900 mm.

Typical dimensions of the coils E could be 50×50 mm, and a typical number could be 8 rows by 8 columns.

While the invention has been described in relation to a superconducting magnet, it is applicable to all types of electromagnets, and is equally applicable to permanent magnets for producing the main field.

The invention has been described with reference to the preferred embodiments. Obviously, modifications and alterations will occur to others upon reading and understanding the preceding description. It is intended that the invention be construed as including all such modifications an alterations insofar as they come within the scope of the appended claims or the equivalents thereof.

What is claimed is:

1. A magnetic resonance imaging apparatus comprising:
   means for generating an axially varying magnetic field distribution having a first field strength at a first region within an imaging region and a second field strength at a second region outside the imaging region, said first and second field strengths being equal and whereby image signals from the first region are subject to aliasing signals from the second region;
   r.f. excitation means for exciting nuclei to resonance, said means including
   an array of coils; and
   means for controlling the amplitude and phase of the signal transmitted by each coil so as to confine the r.f. field generated by the r.f. excitation means to the first region whereby the aliasing signals from the second region are reduced.

2. The apparatus of claim 1 in which an array of coils, controlled in amplitude and phase, is used for receiving r.f. relaxation signals.

3. The apparatus of claim 2 wherein the same coils are used for transmit and receive.

4. The apparatus of claim 1 wherein the first region is a region in which the axially varying magnetic field distribution is linear.

5. The apparatus of claim 4 wherein the coils are arranged cylindrically about the imaging region.

6. The apparatus of claim 5 wherein the coils are arranged in an N×M cylindrical array.

7. The apparatus of claim 6 wherein N=M.

8. An apparatus for use in magnetic resonance imaging comprising:
   means for generating a varying magnetic field in an axial direction, the varying magnetic field having an equal field strength in at least first and second non-contiguous regions in the axial direction, whereby image signals from the first region are subject to aliasing signals from the second region;

a plurality of r.f. coils;

means for scaling at least one of signals (i) applied to the r.f. coils so as to preferentially excite magnetic resonance in nuclei located in the first region; and (ii) received by the r.f. coils so as to preferentially detect magnetic resonance relaxation signals from nuclei located in the first region, whereby the aliasing signals from the second region are reduced.

9. The apparatus of claim 8 wherein the means for scaling adjusts an amplitude and phase of the signals.

10. The apparatus of claim 8 wherein the r.f. coils are small compared to the wavelength of the signals such that the coils do not form a phased array.

11. The apparatus of claim 8 wherein the coils are arranged about a cylinder and in a regular pattern.

12. The apparatus of claim 11 wherein the regular pattern is an N×M array.

13. The apparatus of claim 8 including means for generating a temporally varying axial gradient magnetic field which gradient field is linear over an axial range and wherein the second region is located outside the axial range.

14. A method comprising:

generating a varying magnetic field distribution in an axial direction, the varying magnetic field distribution having an equal field strength in at least first and second non-contiguous regions in the axial direction, the first region being in an examination region, whereby image signals from the first region are subject to aliasing signals from the second region;

using a plurality of r.f. coils to at least one of (i) generate an r.f. field, the phase and frequency of the signals applied to the coils being selected to preferentially excite nuclear magnetic resonance in nuclei located in the first region; and (ii) receive r.f. signals, the phase and frequency of the signals received by the coils being adjusted to preferentially detect nuclear magnetic relaxation signals from nuclei located in the first region, whereby the aliasing signals from the second region are reduced.

15. The method of claim 14 wherein the magnetic field distribution is monotonic over an axial extent and including at least one of (i) selecting the phase and frequency of the signals applied to the coils so that the generated r.f. field is confined to the axial extent; and (ii) adjusting the phase and frequency of the signals received by the coils so that the detected nuclear magnetic relaxation signals are confined to the axial extent.

16. The method of claim 15 including exciting magnetic resonance in nuclei located in an axial slice and adjusting the phase and frequency of the signals received by the coils so that the detected nuclear magnetic relaxation signals are confined to a region in the vicinity of the axial slice.

17. The method of claim 14 including using an N×M cylindrical array of r.f. coils.

* * * * *